United States Patent
Hayashi et al.

[11] Patent Number: 6,141,580
[45] Date of Patent: Oct. 31, 2000

[54] DETECTING COIL FOR MAGNETIC RESONANCE DIAGNOSTIC APPARATUS

[75] Inventors: Yujiro Hayashi; Masaaki Sakuma, both of Tokyo, Japan

[73] Assignee: GE Yokogawa Medical Systems, Limited, Tokyo, Japan

[21] Appl. No.: 09/209,604

[22] Filed: Dec. 11, 1998

[30] Foreign Application Priority Data

Dec. 26, 1997 [JP] Japan ................................. 9-359390

[51] Int. Cl.[7] .................................................. A61B 5/055
[52] U.S. Cl. ............................................ 600/422; 324/318
[58] Field of Search .................................. 600/422, 421; 324/307, 309, 318, 322

[56] References Cited

U.S. PATENT DOCUMENTS

| | | | |
|---|---|---|---|
| 5,435,302 | 7/1995 | Lenkiski et al. | 128/653.5 |
| 5,477,146 | 12/1995 | Jones | 324/318 |
| 5,519,321 | 5/1996 | Hagen et al. | 324/318 |
| 5,543,710 | 8/1996 | Jones | 324/318 |
| 6,023,166 | 2/2000 | Eydelman | 324/318 |

Primary Examiner—Marvin M. Lateef
Assistant Examiner—Eleni Mantis Mercader
Attorney, Agent, or Firm—Moonray Kojima

[57] ABSTRACT

In order not to nip the clothes or skin of a subject between the joining portions of coil members when a detecting coil for a magnetic resonance diagnostic apparatus is fitted around a region of the subject such as the leg or neck, the detecting coil 100 for a magnetic resonance diagnostic apparatus, which can be separated into an upper coil member 10 and a lower coil member 20 and has an annular shape when these members 10, 20 are integrally joined, is provided at the joining portions of the lower coil member 20 with guards 27, 28 of a silicone rubber having a hardness of Hs80.

5 Claims, 6 Drawing Sheets

DETECTING COIL FOR MAGNETIC RESONANCE DIAGNOSTIC APPARATUS

BACKGROUND OF THE INVENTION

The present invention relates to a detecting coil for a magnetic resonance (MR) diagnostic apparatus, and more particularly, to such a coil which is improved so as not to nip the clothes or skin of a subject between the joining portions of coil members when the coil is fitted around a region of the subject such as the leg or neck.

Japanese Patent Application Laid Open No's. 4-354934 (1992) and 6-254068(1994) disclose an RF (radio frequency) coil for an MR imaging apparatus which can be separated into an upper structure and a lower structure and is cylindrically shaped when these structures are integrally joined.

The split detecting coil as disclosed in the above applications is formed so that the coil is in close contact with the region of the subject to be examined such as the leg or neck, in order to efficiently receive an MR signal.

This implies, however, that the coil affords no spatial leeway. The coil members are therefore liable to nip the clothes or skin of the subject between their joining portions when they are integrally joined around the region such as the leg or neck of the subject.

SUMMARY OF THE INVENTION

It is therefore an object of the present invention to provide a detecting coil for an MR diagnostic apparatus which is improved so as not to nip the clothes or skin of a subject between the joining portions of coil members when the coil is fitted around a region of the subject such as the leg or neck.

In accordance with a first aspect, the present invention provides a detecting coil for an MR diagnostic apparatus which consists of two or more coil members and has a cylindrical or annular shape when the coil members are integrally joined, wherein a part or the entirety of each joining portion of the two or more coil members is provided with an elastomeric guard portion.

According to the detecting coil for an MR diagnostic apparatus of the first aspect, catching of the clothes and skin of a subject between the joining portions of the coil members is made unlikely by the cushioning effect of the guard portions. The clothes and skin of the subject are thus prevented from being nipped when the coil is fitted around the region such as the leg or neck of the subject.

The present invention provides an additional advantage that the coil member is protected from damage when accidentally dropped or bumped against a table etc., because the shock is absorbed by the cushioning effect of the guard portion.

Elastomer materials usable in the present invention include: silicone rubbers, nitrile rubbers, fluororubbers, chloroprene rubbers, polyurethane rubbers, butyl rubbers, Thiokol rubbers, polybutadiene rubbers and styrene-butadiene rubbers.

In accordance with a second aspect, the present invention provides the detecting coil for an MR diagnostic apparatus of the foregoing structure, wherein the hardness of the elastomer as determined by the JIS spring hardness test is Hs50–Hs80.

The inventors' studies show that when the hardness of the elastomer as determined by the JIS spring hardness test is less than Hs50, the guard portion is too soft and poor in durability, and when it is more than Hs80, the guard portion is too hard and is difficult to mold. A hardness in the range of from Hs50 to Hs80 inclusive provides moderate cushioning properties and is preferred.

Thus, according to the detecting coil for an MR diagnostic apparatus of the present invention, the likelihood of the clothes and skin of a subject being caught between the joining portions of the coil members is greatly reduced by the cushioning effect of the guard portions, thereby preventing the clothes and skin of the subject from being nipped between the joining portions of the coil members. Moreover, the coil member is protected from damage when accidentally dropped or bumped, because the shock is absorbed by the cushioning effect of the guard portion.

Further objects and advantages of the present invention will be apparent from the following description of the preferred embodiments of the invention as illustrated in the accompanying drawings.

DETAILED DESCRIPTION OF THE INVENTION

Preferred embodiments of the present invention will now be described in detail with reference to the accompanying drawings.

First Embodiment

Figure 1:
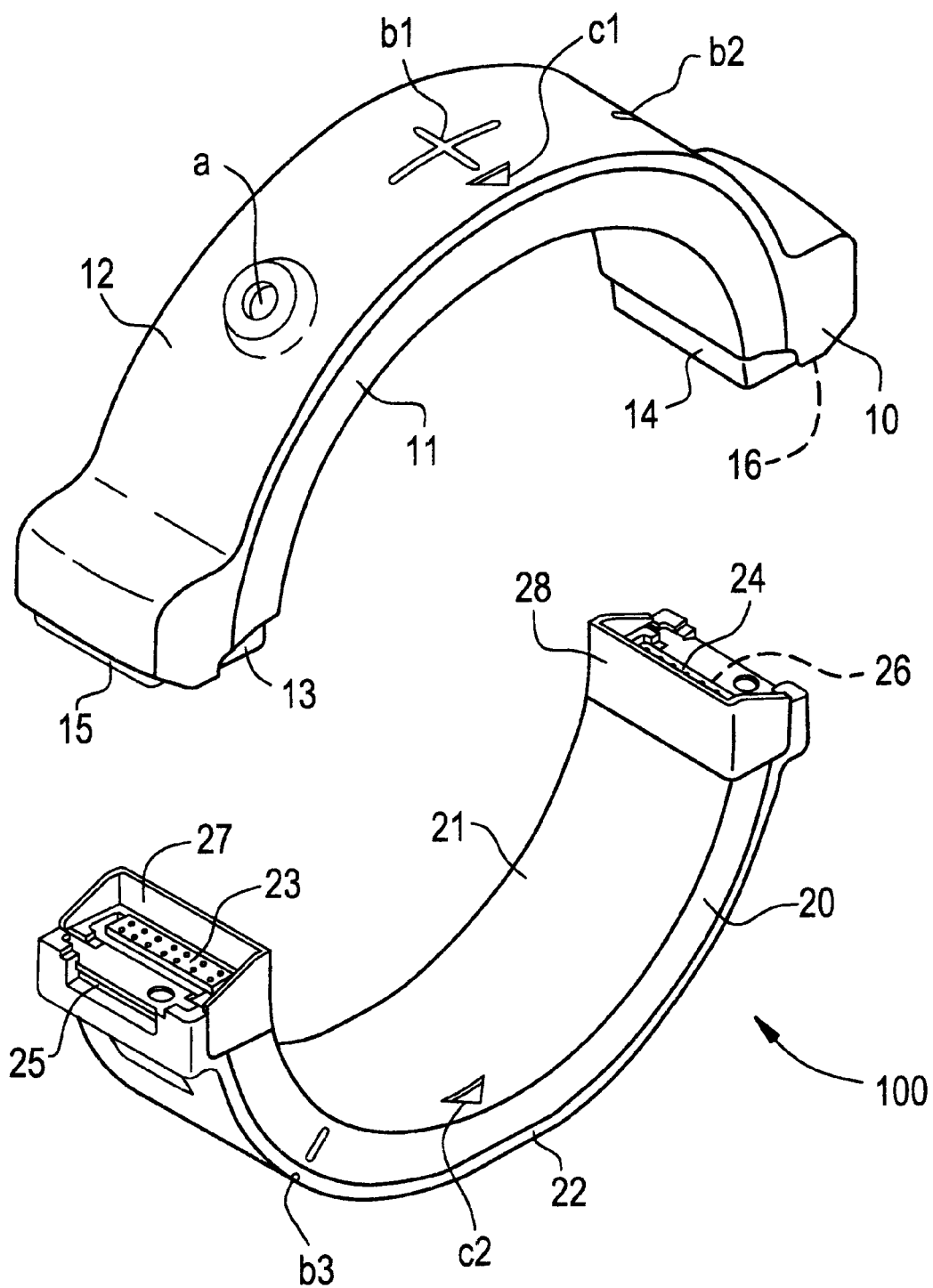
FIG. 1 is an exploded perspective view of a detecting coil for an MR diagnostic apparatus in accordance with a first embodiment of the present invention.

FIG. 1 is an exploded perspective view of a detecting coil for an MR diagnostic apparatus in accordance with a first embodiment of the present invention.

The detecting coil 100 for an MR diagnostic apparatus consists of a semi-annular upper coil member 10 and a semi-annular lower coil member 20.

The upper coil member 10 is covered with covers 11, 12 of urethane resin, and has connectors 13, 14 and locking levers 15, 16 at its joining portions.

The lower coil member 20 is covered with covers 21, 22 of urethane resin, and has connectors 23, 24 and locking concavities 25, 26 at its joining portions.

At the joining portions of the lower coil member 20 are further provided guards 27, 28 of a silicone rubber having a hardness of Hs80. The guards 27, 28 protrude upwardly about 15 mm above the surfaces of the connectors 23, 24. The outer ends of the guards 27, 28 are cut obliquely.

Reference symbol 'a' designates a hole for a signal cable, 'b1' designates a registration mark to which an alignment laser beam is adjusted when the coil is used for a subject raised up (e.g., in imaging the neck region), 'b2' and 'b3' each designates a registration mark to which the alignment laser beam is adjusted when the coil is used rotated 45 degrees (e.g., in imaging the knee region), and 'c1' and 'c2' each designates an alignment mark for orienting the upper coil member 10 and the lower coil member 20.

Figure 2:
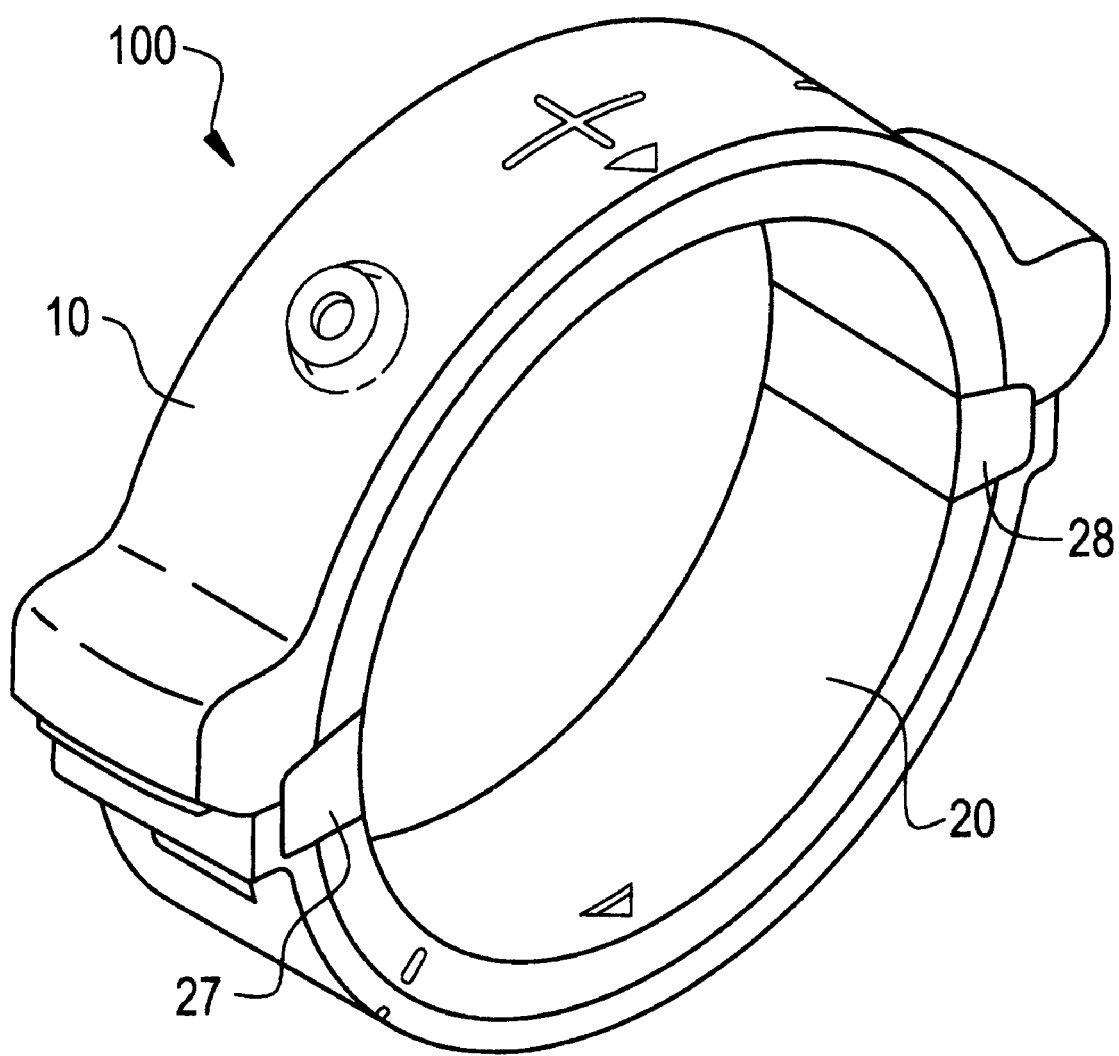
FIG. 2 is a perspective view of the detecting coil for an MR diagnostic apparatus in accordance with the first embodiment in the assembled state.

FIG. 2 is a perspective view showing the upper coil member 10 and the lower coil member 20 integrally joined to form the annular detecting coil 100 for an MR diagnostic apparatus.

Figure 3:
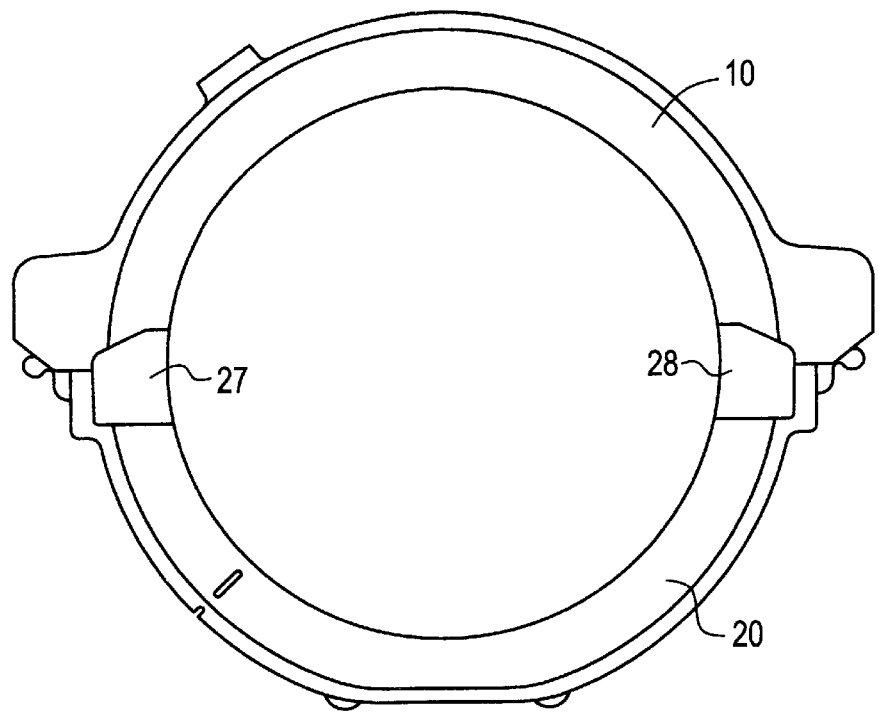
FIG. 3 is a front elevational view of the detecting coil for an MR diagnostic apparatus in accordance with the first embodiment.
Figure 4:
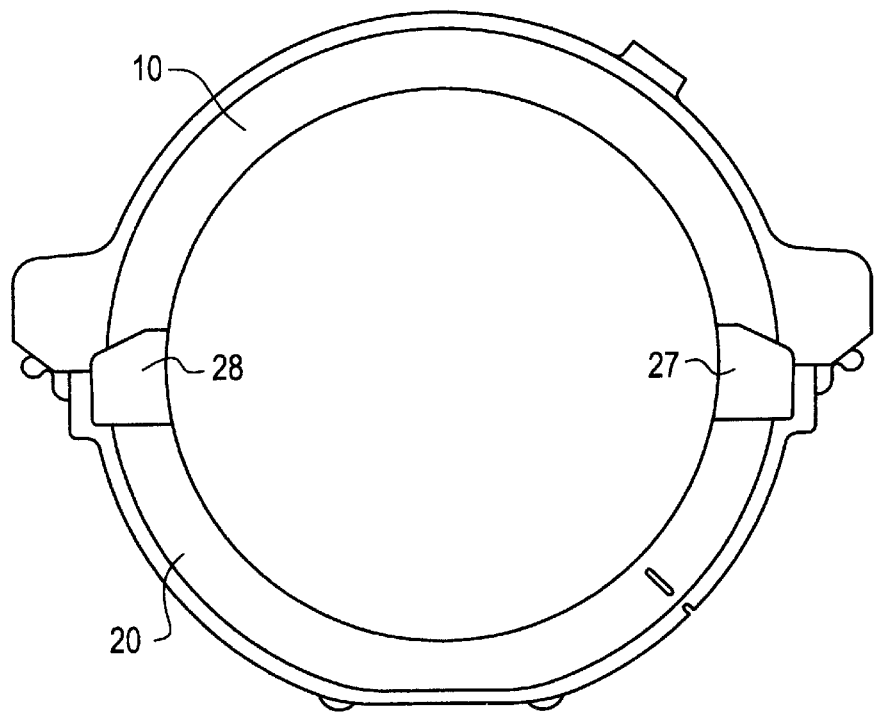
FIG. 4 is a rear elevational view of the detecting coil for an MR diagnostic apparatus in accordance with the first embodiment.
Figure 5:
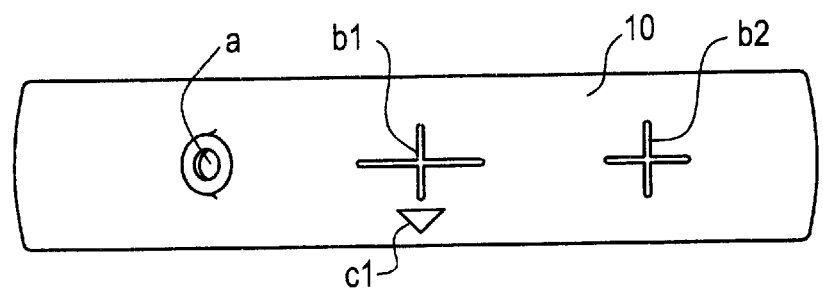
FIG. 5 is a top plan view of the detecting coil for an MR diagnostic apparatus in accordance with the first embodiment.
Figure 6:
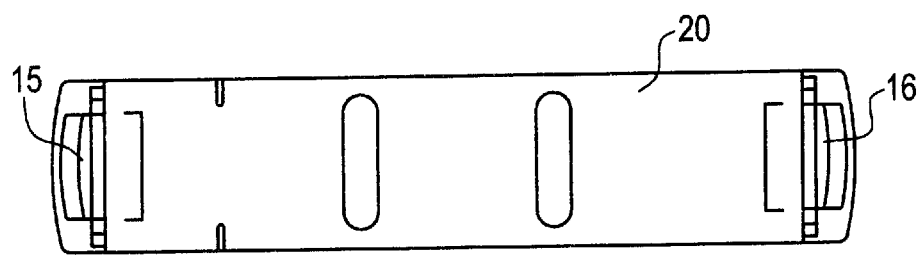
FIG. 6 is a bottom plan view of the detecting coil for an MR diagnostic apparatus in accordance with the first embodiment.
Figure 7:
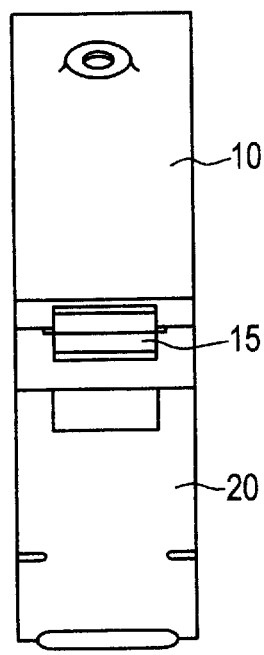
FIG. 7 is a left side view of the detecting coil for an MR diagnostic apparatus in accordance with the first embodiment.
Figure 8:
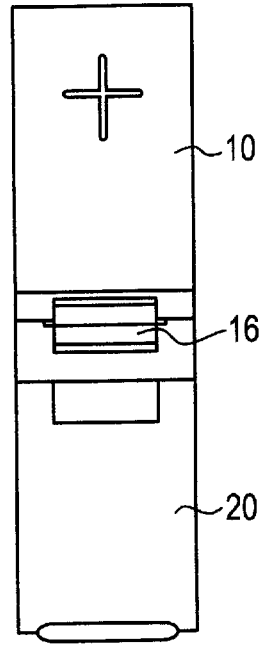
FIG. 8 is a right side view of the detecting coil for an MR diagnostic apparatus in accordance with the first embodiment.

FIG. 3 is a front elevational view, FIG. 4 is a rear elevational view, FIG. 5 is a top plan view, FIG. 6 is a bottom plan view, FIG. 7 is a left side view, and FIG. 8 is a right side view, of the detecting coil 100 for an MR diagnostic apparatus.

Figure 9:
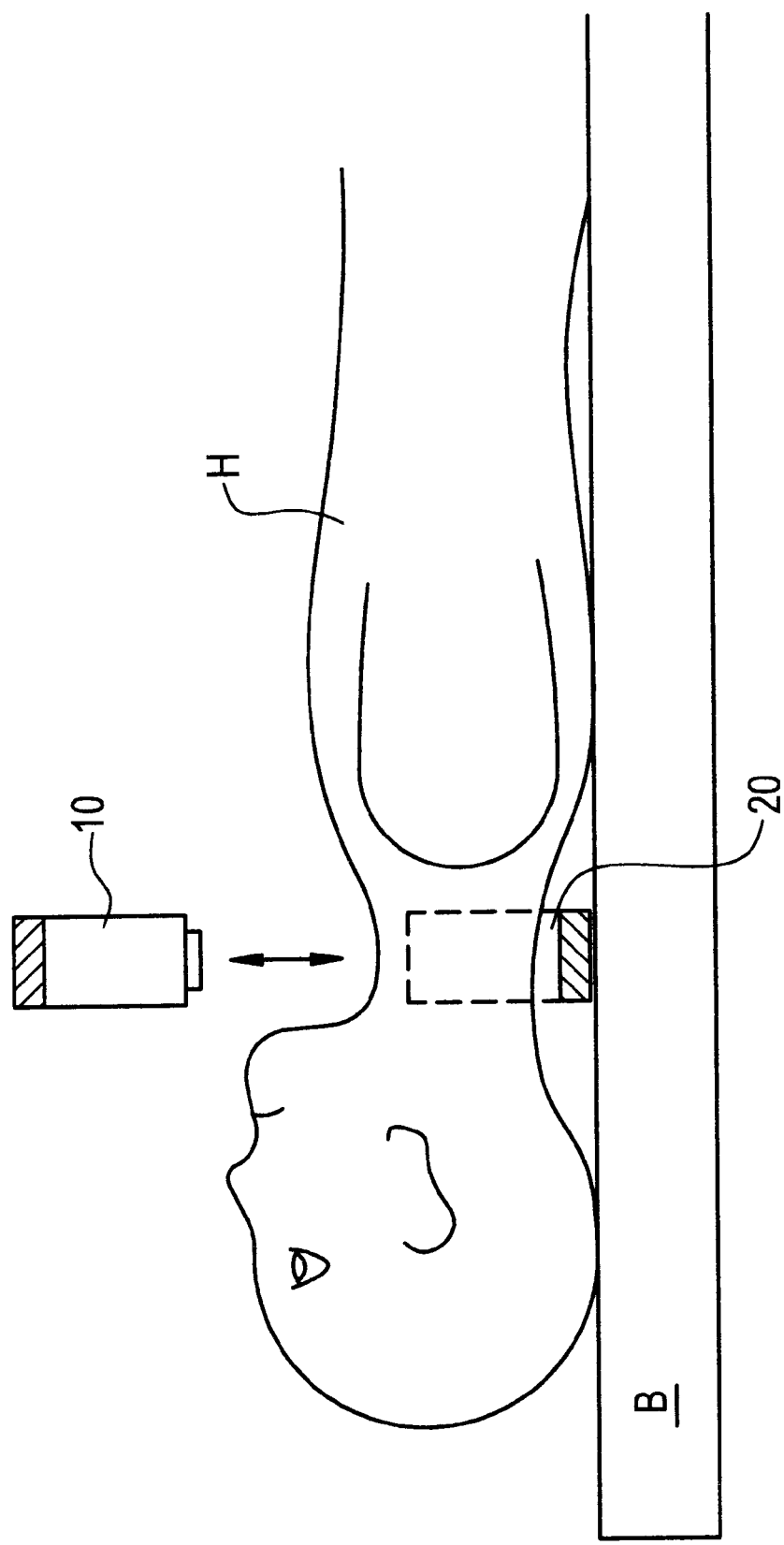
FIG. 9 is a right side view of the detecting coil for an MR diagnostic apparatus in accordance with the first embodiment.

FIG. 9 illustrates the detecting coil 100 of an MR diagnostic apparatus being fitted around the neck of a subject.

The lower coil member 20 is disposed in a space between a bed B and the neck of the subject H lying thereon. The upper coil member 10 is then integrally joined with the lower coil member 20 so that it covers the neck of the subject H. This helps to prevent the clothes and skin of the subject H from resting on the joining portions of the lower coil member 20 because the guards 27, 28 protrude from the joining portions of the lower coil member 20. The clothes and skin of the subject H can be thus prevented from being nipped between the lower coil member 20 and the upper coil member 10.

Since the outer ends of the guards 27, 28 are cut obliquely, the guards 27, 28 serve also as guides for the joining.

Moreover, the lower coil member 20 is protected from damage to the connectors 23, 24 etc. when it is accidentally dropped or bumped against a table etc., because the shock is absorbed by the cushioning effect of the guards 27, 28.

Second Embodiment

Figure 10:
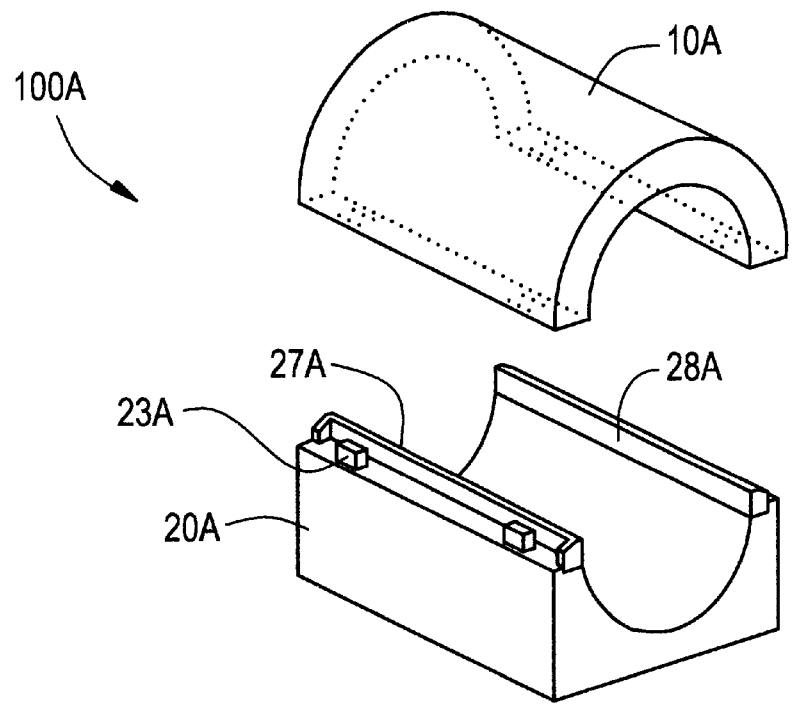
FIG. 10 is an exploded perspective view of a detecting coil for an MR diagnostic apparatus in accordance with a second embodiment of the present invention.

FIG. 10 is an exploded perspective view of a detecting coil for an MR diagnostic apparatus in accordance with a second embodiment of the present invention.

The detecting coil 100A for an MR diagnostic apparatus consists of a semi-annular upper coil member 10A and a pedestal-like lower coil member 20A, and is used for limb imaging.

The lower coil member 20A is provided at its joining portions with a connector 23A etc., and guards 27A, 28A of a silicone rubber having a hardness of Hs80.

Third Embodiment

Figure 11:
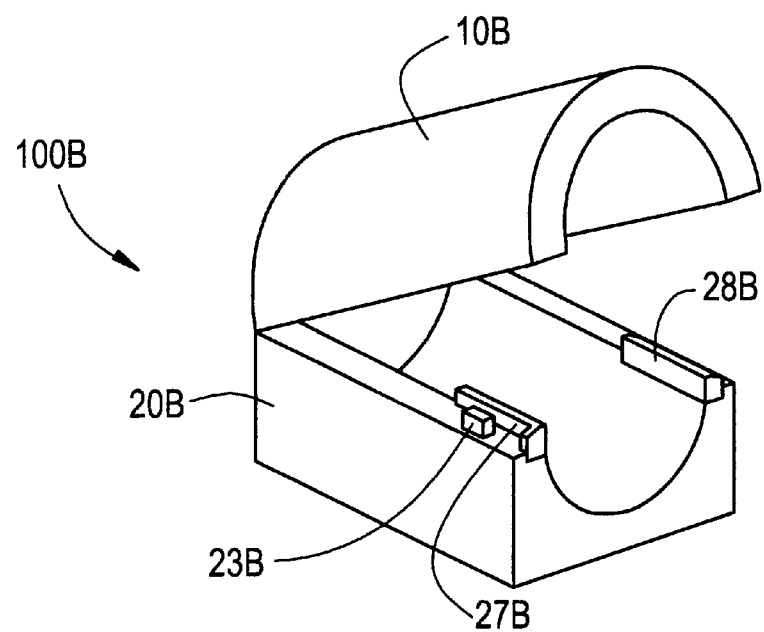
FIG. 11 is a perspective view of a detecting coil for an MR diagnostic apparatus in accordance with a third embodiment of the present invention.

FIG. 11 is a perspective view of a detecting coil for an MR diagnostic apparatus in accordance with a third embodiment of the present invention.

The detecting coil 100B for an MR diagnostic apparatus consists of a semi-annular upper coil member 10B and a pedestal-like lower coil member 20B, and is used for imaging the head region.

The upper coil member 10B and the lower coil member 20B are pivotally attached to each other at their respective ends, and the other ends are configured to be opened and closed. At the joining portions on the side of the open-and-close ends are provided a connector 23B etc., and guards 27B, 28B of a silicone rubber having a hardness of Hs80.

Many widely different embodiments of the invention may be configured without departing from the spirit and the scope of the present invention. It should be understood that the present invention is not limited to the specific embodiments described in the specification, except as defined in the appended claims.

What is claimed is:

1. In a coil assembly for MR diagnostic apparatus comprising:

a pair of annular coil members; and connecting means for connecting the pair of annular coil members to form a hollow cylindrical or annular shape thereof; the improvement wherein said connecting means comprises a guard portion extending an axial length of an inside diameter of each of two ends of one of said pair of annular coil members and above the face of said two ends; and wherein corresponding ends of the other of said pair of annular coil members have connecting portions removed from surfaces of said ends of said other pair of annular coil members so that in a closed state the pair of annular coil members are fitted together smoothly with the spaces between the ends of both annular coil members being covered by said guard portions.

2. The coil assembly of claim 1, wherein the ends of both of said annular coil members have inter-locking connections thereon.

3. The coil assembly of claim 1, wherein said guard portions are cut obliquely, and a surface of the other of said pair of annular coil members is correspondingly cut obliquely at the ends thereof.

4. The coil assembly of claim 1, wherein connector means are disposed on the ends of one coil member and corresponding holes are formed on the other ends of the other coil member so that in a closed state, the connector means are engaged in said corresponding holes.

5. The coil assembly of claim 1, wherein said guard portions comprise an elastomer of hardness JIS Hs50–Hs80.

* * * * *